United States Patent [19]

Melzner

[11] Patent Number: 5,500,384
[45] Date of Patent: Mar. 19, 1996

[54] METHOD FOR MANUFACTURING A BIT LINE VIA HOLE IN A MEMORY CELL

[75] Inventor: Hanno Melzner, Grosshelfendorf, Germany

[73] Assignee: Siemens Aktiengesellschaft, Munich, Germany

[21] Appl. No.: 294,333

[22] Filed: Aug. 23, 1994

[30] Foreign Application Priority Data

Sep. 8, 1993 [DE] Germany .............. 43 30 471.0

[51] Int. Cl.$^6$ .................... H01L 21/70; H01L 27/00
[52] U.S. Cl. .................... 437/60; 437/919; 437/52
[58] Field of Search .................... 437/47, 52, 60, 437/919; 257/906, 908, 303, 306–307

[56] References Cited

U.S. PATENT DOCUMENTS

| 5,135,881 | 8/1992 | Saeki | 437/52 |
| 5,206,183 | 4/1993 | Dennison | 437/47 |
| 5,223,448 | 6/1993 | Su | 437/47 |
| 5,272,103 | 12/1993 | Nakamura | 437/52 |

FOREIGN PATENT DOCUMENTS

0478262A1  4/1992  European Pat. Off. .

OTHER PUBLICATIONS

Patent Abstracts of Japan, vol. 12, No. 320 (–651)(3167), JP 63–84149 (Hitachi Ltd.) Apr. 14, 1988.
Patent Abstracts of Japan, vol. 17, No. 672 (E–1474), JP-A–05 226 583 (NEC Corp) 3, Sep. 1993.
Patent Abstracts of Japan, vol. 17, No. 514 (E–1433), 1 Jun. 1993 JP A–05 136 124 (Fujitsu Ltd).

Article "A Self–Aligned Contact Process With Improved Surface Planarization" by Kusters et al, Journal De Physique, Cr, Tome 49, Sep. 1988 at C4–503.

"Two Step Deposited Rugged Surface (TDRS) Storagenode and Self Aligned Bitline–Contact Penetrating Cellplate (SABPEC) for 64 MbDRAM STC Cell" by Itoh, Oki Electric Industry Co., Ltd. pp. 9–10, VLSI Symposium 1991.

*Primary Examiner*—George Fourson
*Assistant Examiner*—H. Jey Tsai
*Attorney, Agent, or Firm*—Hill, Steadman & Simpson

[57] ABSTRACT

An improved method for manufacturing a bit line via hole for a memory cell is disclosed wherein changes in the topography of a conductive layer forming the cell plate that are caused by the capacitor are utilized for producing an etching mask for the bit line via hole. A depression is formed because the second source/drain region of the transistor which is to be contacted by the bit line is not covered by the lower capacitor plate. The etching mask is not produced in the depression but only at the raised locations and is therefore self-aligned above the second S/D region.

13 Claims, 2 Drawing Sheets

METHOD FOR MANUFACTURING A BIT LINE VIA HOLE IN A MEMORY CELL

BACKGROUND OF THE INVENTION

1. Field of the Invention

The present invention relates to an improved method for manufacturing a semiconductor memory cell and, more particularly, this invention relates to an improved method for manufacturing a bit line via hole in a semiconductor memory cell.

2. DESCRIPTION OF THE RELATED ART

The present invention is directed to a method for manufacturing a bit line via hole for a memory cell in a semiconductor substrate having a capacitor located above an MOS transistor and a bit line above the capacitor wherein a lower capacitor plate is connected to a first source/drain (S/D) region of the transistor. In order to achieve high packing density in such DRAM memory cells, it is desirable to design the cell so that the bit line is located above a stacked capacitor. In these designs the lower capacitor plate is connected to a first S/D region of the transistor.

The problem with prior art designs of this type is in the difficulty encountered in producing the bit line contact at the S/D region of the transistor through the capacitor level. The capacitors cannot fill the entire cell area but must leave room for the bit line contact which must connect at least one but usually two memory cells. The spacing of the capacitors from the edge of the bit line via hole thus defines the effective space requirements for the bit line contact—in addition to the size of the via hole itself—and should thus be as small as possible. Adequate insulation must also be provided between the bit line and the lower capacitor plate and the cell plate. It is also desirable to have the bit line contact overlap the gate insulation and the field insulation to prevent these insulations from being damaged during the manufacturing process.

Various methods for manufacturing memory cells are known in the art. An article by Itoh, et al. in VLSI Symposium 1991, at page 9, describes a manufacturing process for a bit line via hole wherein a spacer is produced at the side walls of the via hole for insulation and structuring of the cell plate before deposition of the insulation layer is foregone. In this design, however, the actual contact area is greatly diminished since the spacer must have at least the thickness of the necessary insulating distance. Furthermore, self-alignment relative to the gate and/or field oxide is not provided in this design.

An article by Kuesters, et al. in Journal de Physique, C4, vol. 49, September 1988, page C4-503 and the corresponding European patent application No. 0 258 657 from the same individuals disclose thermally oxidizing the exposed edge of the cell plate instead of forming spacers thus providing a relatively large contact area. Japanese application No. JP 2-79 462 illustrates a DRAM memory cell where a bit line is connected via a pad electrode to the S/D region that may be partially overlapped by the capacitor plates. The cell plate is thereby structured with a photo technique. Alignment errors, therefore, must be taken into account with this design.

All of these known methods require a photo technique for producing the bit line via hole, i.e., a photoresist layer must be applied, exposed and developed, which, therefore, requires consideration of alignment tolerances.

An object of the present invention is to provide a method for manufacturing a bit line via hole for a memory cell without utilizing a photo technique while maintaining an adequate insulation distance from the capacitor.

SUMMARY OF THE INVENTION

The present invention provides that the topography of a conductive layer forming the cell plate which is caused by the capacitor be utilized for producing an etching mask for the bit line via hole. A depression is formed over the second S/D region of the transistor between the lower capacitor plate and the capacitor of an adjacent cell because the second S/D region of the transistor which is to be contacted by the bit line is not covered by the lower capacitor plate. The etching mask is not produced in the depression but is only produced at the raised locations and is, therefore, self-aligned relative to the second S/D region.

In one preferred embodiment of the present invention, the spacing of memory cells adjacent to the lower capacitor plates is greater over the second S/D region than over the remaining semiconductor substrate, such as, for example, over insulating regions that insulate neighboring memory cells from one another. The narrow spacings are filled upon application of a conductive layer for the cell plate, generally polysilicon, whereas a depression is produced in the broad spacings, i.e. over the second S/D region. When an auxiliary structure is introduced into the depression, an etching mask can be produced on the remaining, raised surface, this etching mask being self-aligned relative to the lower capacitor plate that produces the topography.

The depression can be provided with a lacquer plug as an auxiliary structure, in that lacquer is applied surface-wide and is etched back or exposed back until the raised surface of the conductive layer is uncovered. The uncovered surface can be converted into a material suitable as an etching mask, for example on the basis of an oxidation or nitridation process, however, the entire layer of thickness of the cell plate is not covered. A suitable material can also be selectively deposited on the uncovered polysilicon. The etching mask that is obtained, depending upon the selectivity of the etching process, must enable the complete etch-through of the conductive layer, potentially down to the semiconductor substrate.

When oxidation is utilized for producing the etching mask, it is advantageous to apply an auxiliary layer, such as nitride, surface-wide before producing the lacquer or resist plugs and to remove this in turn with the lacquer or resist plugs as a mask. The lacquer or resist plugs can be removed and silicon nitride as an oxidation mask remains in the depressions. The auxiliary structure can be produced of other materials as well. Temperature-resistant materials are suitable, and a chemical metallic polishing, for example, may be utilized for that purpose.

The etching mask can be applied onto the raised surface of the cell plate, for example with a selective deposition, thus partially reducing the temperature stress. For example, selective metal deposition processes are known in the prior art; however, the selective deposition of an insulating layer is especially suitable, preferably at low temperatures. European application no. 92 113 281.7 filed 4 Aug. 1992 discloses an appropriate silicon oxide deposition method (the auxiliary structure of the present invention must potentially be manufactured of a temperature-resistant material). Intermediate layers can be present between the cell plate and the etching mask or, respectively, the auxiliary structure.

The necessary topography for producing the etching mask-broad spacings only over regions to be contacted-can be produced not only on the basis of the layout of the lower capacitor plate but can also be produced in conjunction with suitable, other measures.

These and other features of the invention are discussed in greater detail below in the following detailed description of the presently preferred embodiments with reference to the accompanying drawings.

DETAILED DESCRIPTION OF THE PRESENTLY PREFERRED EMBODIMENTS

Figure 1:
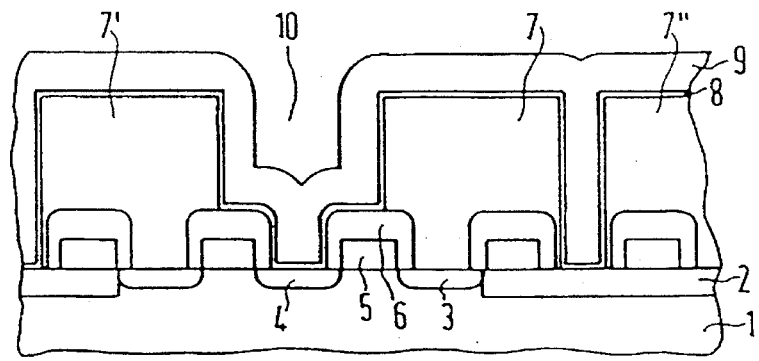
FIG. 1 illustrates a cross-section of a transistor for a memory cell located on a silicon semiconductor substrate prior to processing in accordance with the present invention.

FIG. 1 illustrates an insulation region and a transistor that comprises a first S/D region 3, a second S/D region 4 and a gate 5 which are produced in or, respectively, on a silicon semiconductor substrate 1. The gate 5 is insulated from the semiconductor substrate 1 by a gate oxide (not shown) and the remaining surfaces are provided with an insulating gate encapsulation 6. The first S/D region 3 is connected to a lower capacitor plate 7 (memory electrode) of what is referred to as a stack capacitor, this being produced from a doped polysilicon layer. In order to increase the capacitance, the lower capacitor plate can also be key-shaped or crown-shaped.

Lower capacitor plates 7 and 7' of neighboring memory cells between which a bit line contact to the second S/D region is to be produced must be formed with sufficiently large spacing. In this exemplary embodiment, a bit line contact is provided for both memory cells; the analogous case applies to memory cells having a bit line contact for each cell. The capacitor plates 7 and 7" are produced with a slight spacing from one another at locations where no contact to the substrate 1 is provided; the spacing is preferably so small that it is filled by the cell plate to be produced later.

After production of the lower capacitor plate 7, a capacitor dielectric 8 is applied at least on the lower capacitor plate; what is referred to as an ONO layer is preferably produced surface-wide. A doped silicon layer 9 for the cell plate is then deposited, namely with such a thickness such that the small spacings are essentially filled but a depression 10 remains in the wide spacings. This depression exists only over the second S/D region.

Figure 2:
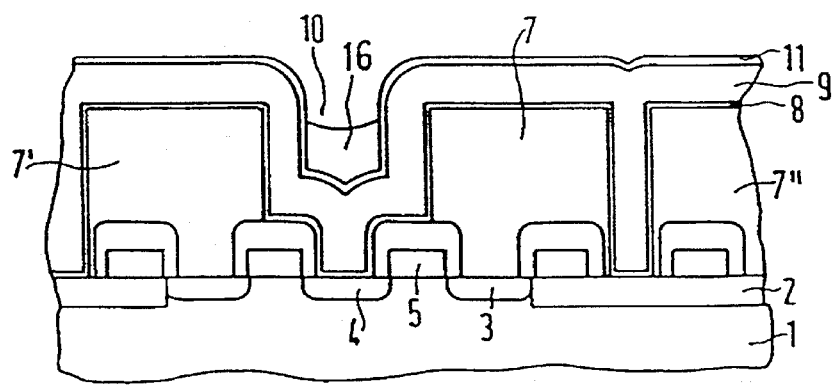
FIG. 2 illustrates the memory cell of FIG. 1 after a layer of silicon nitride has been deposited on the cell plate.
Figure 3:
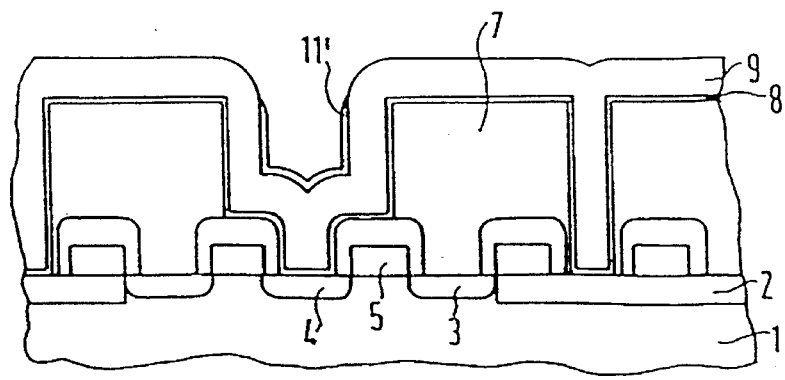
FIG. 3 illustrates the memory cell of FIG. 1 after selective etching of the silicon nitride.
Figure 4:
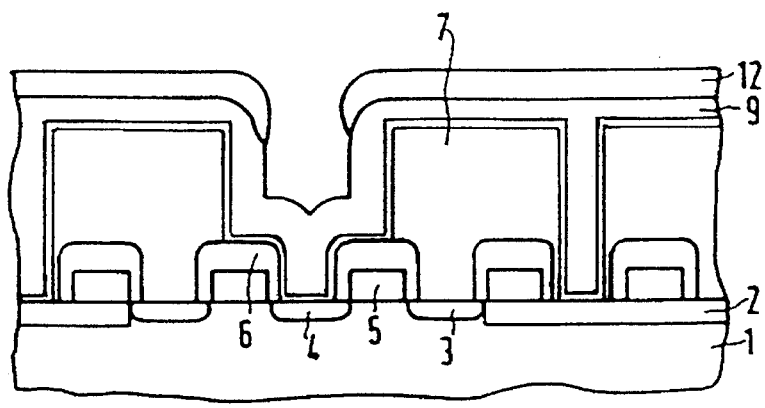
FIG. 4 illustrates the memory cell of FIG. 1 after production of an etching mask.
Figure 5:
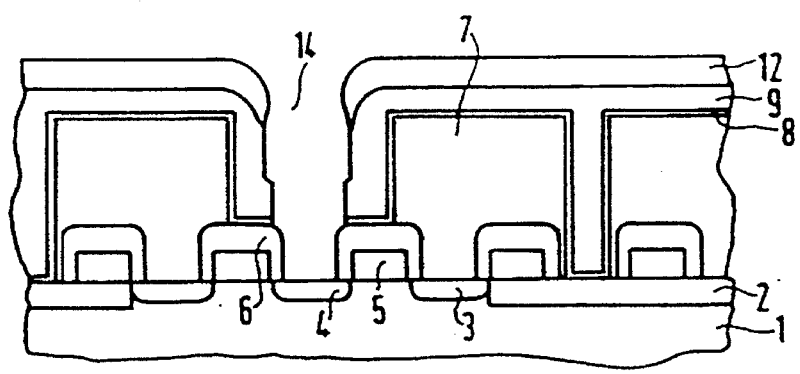
FIG. 5 illustrates the memory cell of FIG. 1 after anisotropic etching of a polysilicon layer with an oxide mask.

FIG. 2 illustrates a silicon nitride layer 11 having a thickness of approximately 10–30 nm which has been deposited on the cell plate. A planarizing layer, such as, for example photoresist, is applied and etched back or exposed back surface-wide, so that a resist plug 16 remains only in the unfilled depression 10. In FIG. 3, the silicon nitride 11 is etched selectively relative to the resist plug. After the removal of the resist plug 16, the underlying portion of the nitride layer 11 forms an auxiliary structure 11'. Since the nitride etching is preferably implemented anisotropically, the nitride 11'—regardless of the shape of the resist plug—extends down to the upper edge of the depression 10. As a result thereof, further process latitude is established in the manufacture of the plug 16. In FIG. 4, an etching mask 14 is produced, for example by an oxidation process, on the raised surface of the cell plate 9 selectively relative to the auxiliary structure 11'. The entire raised surface is then covered with silicon oxide, whereas the unoxidized, doped polysilicon remains therebelow as cell plate. The auxiliary structure 11' is preferably removed wet. In FIG. 5, the polysilicon 9 is anisotropically etched with the oxide mask 14.

Figure 6:
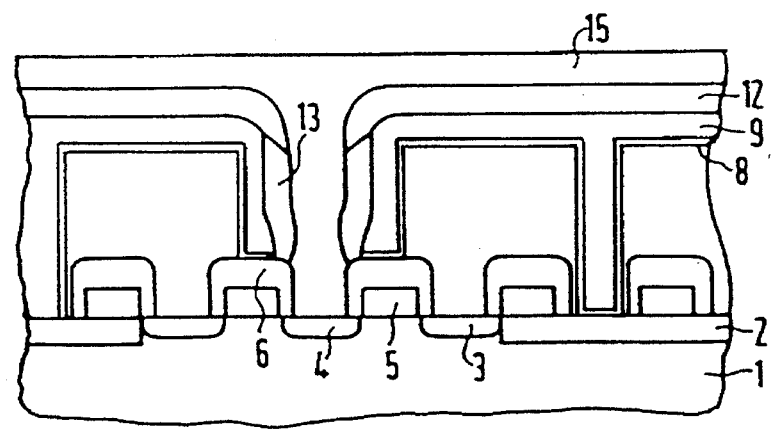
FIG. 6 illustrates the bit line via hole after processing in accordance with the present invention is complete.

The capacitor dielectric 8 is selectively removed relative to the gate encapsulation 6, so that a self-aligned bit line via hole 14 is formed. In FIG. 6, the uncovered edge of the cell plate 9 is provided with an edge insulation 13, either on the basis of a further oxidation or with a spacer. The capacitor dielectric 8 under the cell plate is removed either after the etching of the cell plate or during the spacer etching. In any event, the gate encapsulation 6 is not damaged during the etching of the bit line via hole 14.

A field oxide which may be present (outside the plane of section) is likewise not attacked. The contact is thus self-aligned relative to the gate, relative to the field oxide, as well as relative to the upper and lower cell plate. The memory arrangement can now be finished with known methods (production of a bit line 15, etc.). The oxidized polysilicon layer 12 remains under the bit line 15 as insulation layer.

The present invention is subject to many variations, modifications, and changes in detail. It is intended that all matter described in the specification and shown in the accompanying drawings be considered illustrative only. Accordingly, it is intended that the invention be limited only by the spirit and scope of the appended claims.

I claim:

1. A method for manufacturing a bit line via hole of a memory cell, wherein a transistor of the memory cell is comprised of first and second source/drain regions and a gate region, the first source/drain region being connected to a lower capacitor plate and the second source/drain region having a space above its surface, said method comprising the steps of:

applying a conductive layer over the space above the second source/drain region and lower capacitor plate to form a depressed portion of the conductive layer over the second source/drain region;

applying a self-aligned bit line via hole mask, which is self-aligned relative to the second source/drain region, to the conductive layer other than at the depressed portion; and etching a bit line via hole in the depressed portion of the conductive layer.

2. The method for manufacturing a bit line via hole of a memory cell of claim 1, wherein the space above the second source/drain region is formed as a result of a spacing formed between the lower capacitor plate and a capacitor of an adjacent cell.

3. The method for manufacturing a bit line via hole of a memory cell of claim 1, further comprising the step of forming an auxiliary structure exclusively on the depressed portion prior to etching of the bit line via hole.

4. The method for manufacturing a bit line via hole of a memory cell of claim 3, wherein the step of forming the auxiliary structure includes forming and etching a planarizing layer.

5. The method for manufacturing a bit line via hole of a memory cell of claim 4, wherein the step of forming the auxiliary structure further includes forming an auxiliary layer comprising a temperature resistant material.

6. The method for manufacturing a bit line via hole of a memory cell of claim 5, wherein the step of applying the mask is comprised of thermally treating a surface of the conductive layer which is not covered by the auxiliary structure.

7. A method for manufacturing a bit line via hole of a memory cell, wherein a transistor of the memory cell is comprised of first and second source/drain regions and a gate region, the first source/drain region being connected to a lower capacitor plate, said method comprising the steps of:

applying a conductive layer over the second source/drain region and lower capacitor plate to form a depressed portion of the conductive layer over the second source/drain region;

applying a silicon nitride layer over the conductive layer;

applying a planarizing layer over the silicon nitride layer and etching the planarizing layer to form a resist plug above the depressed portion;

selectively etching the silicon nitride layer and removing the resist plug to provide an auxiliary structure of silicon nitride which covers a surface of the depressed portion; and applying an etching mask over the conductive layer and removing the auxiliary structure of silicon nitride and subsequently etching an exposed portion of the conductive layer to expose a surface of the second source/drain region to form a bit line via hole.

8. The method for manufacturing a bit line via hole of a memory cell of claim 7, wherein the lower capacitor plate is crown shaped.

9. The method for manufacturing a bit line via hole of a memory cell of claim 7, wherein the planarizing layer is photoresist.

10. The method for manufacturing a bit line via hole of a memory cell of claim 7, wherein the conductive layer is doped silicon.

11. The method for manufacturing a bit line via hole of a memory cell of claim 7, further comprising an additional step of providing an edge insulation on an uncovered edge of the conductive layer.

12. The method for manufacturing a bit line via hole of a memory cell of claim 11, wherein the edge insulation is a spacer.

13. The method for manufacturing a bit line via hole of a memory cell of claim 11, wherein said step of providing edge insulation includes oxidizing the conductive layer.

* * * * *